United States Patent
Scholl et al.

(10) Patent No.: US 11,951,959 B2
(45) Date of Patent: Apr. 9, 2024

(54) APPARATUS FOR PROVIDING A SENSOR SIGNAL FOR EVALUATION FOR A BRAKING SYSTEM OF A VEHICLE, METHOD AND CONTROL UNIT FOR EVALUATING A SENSOR SIGNAL FOR A BRAKING SYSTEM OF A VEHICLE, AND BRAKING SYSTEM FOR A VEHICLE

(71) Applicant: Knorr-Bremse Systeme Fuer Nutzfahrzeuge GmbH, Munich (DE)

(72) Inventors: Frank Scholl, Ingersheim (DE); Dieter Winz, Rottenburg (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 472 days.

(21) Appl. No.: 17/310,040

(22) PCT Filed: Dec. 19, 2019

(86) PCT No.: PCT/EP2019/086233
§ 371 (c)(1),
(2) Date: Jul. 13, 2021

(87) PCT Pub. No.: WO2020/148064
PCT Pub. Date: Jul. 23, 2020

(65) Prior Publication Data
US 2022/0089140 A1    Mar. 24, 2022

(30) Foreign Application Priority Data
Jan. 18, 2019 (DE) .................... 10 2019 101 352.6

(51) Int. Cl.
*B60T 17/22* (2006.01)
*G01R 31/00* (2006.01)

(52) U.S. Cl.
CPC .......... *B60T 17/221* (2013.01); *G01R 31/006* (2013.01); *B60T 2270/406* (2013.01); *B60T 2270/415* (2013.01)

(58) Field of Classification Search
CPC ............. B60T 17/221; B60T 2270/406; B60T 2270/415; B60T 8/88; B60T 8/885;
(Continued)

(56) References Cited

U.S. PATENT DOCUMENTS

| 4,692,299 A | 9/1987 | Crew et al. |
| 5,633,797 A | 5/1997 | Hornback |

(Continued)

FOREIGN PATENT DOCUMENTS

| CN | 105301277 A | 2/2016 |
| CN | 106352933 A | 1/2017 |
| DE | 19911526 A1 | 9/2000 |
| DE | 102006050832 A1 | 4/2008 |
| DE | 102009046450 A1 | 5/2011 |
| JP | 2011098607 A | 5/2011 |

(Continued)

OTHER PUBLICATIONS

International Search Report for PCT/EP2019/086233 dated Apr. 20, 2020.

*Primary Examiner* — Xin Y Zhong
(74) *Attorney, Agent, or Firm* — NORTON ROSE FULBRIGHT US LLP; Gerared A. Messina

(57) ABSTRACT

An apparatus for providing a sensor signal (SS) for evaluating a vehicle braking system, including: a first signal-path (SP) for outputting the SS to a first output-interface (OI) to a first converter-device (CD), the first SP having first electronic-components (EC), and is electrically connectable to an input-interface (II) to a vehicle sensor (VS); a first test-device (TD) for applying a first test-signal (TS) to the SS in the first SP, the first TD being electrically connectable to the first SP; a second SP for outputting the SS to a second OI to a second CD, the second SP having second EC, and is electrically connectable to the II to the VS; and a second TD (Continued)

for applying a second TS to the SS in the second SP, the second TD being electrically connectable to the second SP. Also described are a method, control unit, braking system, and computer readable medium.

12 Claims, 3 Drawing Sheets

(58) Field of Classification Search
CPC ....... B60T 17/22; G01R 31/006; G01R 31/54; G01D 2218/10; G01D 3/08; G01D 18/00; H04Q 2209/86; H04Q 9/00; G08C 25/00
See application file for complete search history.

(56) References Cited

U.S. PATENT DOCUMENTS

| | | |
|---|---|---|
| 2011/0031976 A1 | 2/2011 | Ishikawa et al. |
| 2012/0016623 A1 | 1/2012 | Hayner |
| 2012/0074972 A1* | 3/2012 | Rasbornig ............... B60T 8/885 324/750.3 |
| 2015/0145522 A1 | 5/2015 | Oster et al. |
| 2018/0011140 A1* | 1/2018 | Chaware ............ G01R 31/2884 |

FOREIGN PATENT DOCUMENTS

| | | |
|---|---|---|
| JP | 2012068248 A | 4/2012 |
| JP | 2012108029 A | 6/2012 |
| JP | 2013 113624 A | 6/2013 |

* cited by examiner

APPARATUS FOR PROVIDING A SENSOR SIGNAL FOR EVALUATION FOR A BRAKING SYSTEM OF A VEHICLE, METHOD AND CONTROL UNIT FOR EVALUATING A SENSOR SIGNAL FOR A BRAKING SYSTEM OF A VEHICLE, AND BRAKING SYSTEM FOR A VEHICLE

FIELD OF THE INVENTION

The present invention relates to an apparatus for providing a sensor signal for evaluation for a braking system of a vehicle, to a method and a control unit for evaluating a sensor signal for a braking system of a vehicle, and to a braking system for a vehicle.

BACKGROUND INFORMATION

When evaluating safety-relevant sensor signals in particular, a signal path of an evaluation circuit should be tested regularly. In this case, the sensor signal is usually captured only via one path, in particular. In this case, a plausibility check can be carried out only using further methods. During the test, for example with test signals or test patterns, the situation may arise in which the actual sensor signal is not available or cannot be readily evaluated.

SUMMARY OF THE INVENTION

Against this background, the object of the present invention is to provide an improved apparatus for providing a sensor signal for evaluation for a braking system of a vehicle, an improved method for evaluating a sensor signal for a braking system of a vehicle, an improved control unit and an improved braking system for a vehicle.

This object is achieved by an apparatus for providing a sensor signal for evaluation for a braking system of a vehicle, by a method for evaluating a sensor signal for a braking system of a vehicle, by a corresponding control unit, by a corresponding computer program and by a braking system for a vehicle according to the main description herein.

According to embodiments, sensor signals can be reliably tested and evaluated, in particular. In this case, a signal path and a test circuit can be implemented in duplicate, for example, and can be guided to two independent evaluation units, in particular analog/digital converters. While a test is being carried out on one of the two signal paths, the sensor signal may still be available on the other signal path. In particular, it is possible to evaluate a pressure sensor signal from a trailer control module (TCM) of a commercial vehicle. The signal path may be tested or checked at least twice every 50 milliseconds, for example, in which case evaluation of the sensor signal does not need to be interrupted or distorted, for example.

According to embodiments, a sensor signal may also be advantageously evaluated continuously during a test pattern, in particular. For example, a safety-relevant sensor signal, for example a voltage value from a pressure sensor, can be evaluated via one signal path and the respective other signal path can be tested. In this case, both signal paths can be regularly checked in succession by alternating operation. In particular, it is possible to prevent distortion or a lack of availability of a sensor signal on account of test signals or test patterns. A quality or a state of an analog/digital converter can therefore also be tested, in particular.

An apparatus for providing a sensor signal for evaluation for a braking system of a vehicle is presented, wherein the apparatus has the following features:

a first signal path for outputting the sensor signal to a first output interface to a first converter device, wherein the first signal path has first electronic components, wherein the first signal path is electrically connected to an input interface to a sensor of the vehicle;

a first test device for applying a first test signal to the sensor signal in the first signal path, wherein the first test device can be or is electrically connected to the first signal path;

a second signal path for outputting the sensor signal to a second output interface to a second converter device, wherein the second signal path has second electronic components, wherein the second signal path is electrically connected to the input interface to the sensor of the vehicle; and a second test device for applying a second test signal to the sensor signal in the second signal path, wherein the second test device can be or is electrically connected to the second signal path.

The vehicle may be a commercial vehicle, for example a truck or the like. The sensor may be in the form of a pressure sensor or another sensor for the braking system. The braking system may have a trailer control module. The sensor signal may represent an electrical voltage. The first converter device may be in the form of a first analog/digital converter or in the form of a first channel of an analog/digital converter. The second converter device may be in the form of a second analog/digital converter or in the form of a second channel of the analog/digital converter. A single input signal path may be present at the input interface. The input signal path at the input interface may branch into the first signal path and into the second signal path, in particular at a branching point. The first test signal and the second test signal may have an identical signal characteristic. Each of the test signals may represent an electrical voltage.

According to one embodiment, the first test device may have a first electrical test voltage source for generating the first test signal and a first switching device for connecting the first test device to the first signal path with signal transmission capability. The second test device may have a second electrical test voltage source for generating the second test signal and a second switching device for connecting the second test device to the second signal path with signal transmission capability. Such an embodiment provides the advantage that it is possible to alternately apply the test signals to the sensor signal in the two signal paths in a simple and reliable manner.

The first test device may also have a first electrical test resistor and additionally or alternatively a parallel circuit comprising one or two first test diodes. The second test device may have a second electrical test resistor and additionally or alternatively a parallel circuit comprising one or two second test diodes. Such an embodiment provides the advantage that it is possible to check the signal paths and the converter devices in an uncomplicated and reliable manner.

In particular, the first electronic components of the first signal path may have two first electrical resistors, which are electrically connected in series with one another, and a first capacitance. The first test device may be electrically connected to the first signal path between the first resistors. Between the first resistors and the first output interface, the first capacitance may be electrically connected between the first signal path and ground. The second electronic components of the second signal path may have two second electrical resistors, which are electrically connected in series with one another, and a second capacitance. The second test device may be electrically connected to the second signal path between the second resistors. Between the second resistors and the second output interface, the second capacitance may be electrically connected between the second signal path and ground. Such an embodiment provides the advantage that it is possible to accurately evaluate the sensor signal in a simple manner with alternating testing and evaluation for each signal path.

The apparatus may also have an electrical input resistor which is electrically connected between the input interface and ground. Such an embodiment provides the advantage that loading of the sensor signal by the apparatus can be represented in a simple manner.

A method for evaluating a sensor signal for a braking system of a vehicle is also presented, wherein the method can be carried out in conjunction with an embodiment of the apparatus mentioned above, wherein the method has the following steps of:

applying the first test signal only to the sensor signal in the first signal path;

reading in the sensor signal, to which the first test signal has been applied, from the first output interface to the first signal path in order to test the first signal path and the first converter device, and reading in the sensor signal from the second output interface to the second signal path in order to evaluate the sensor signal;

applying the second test signal only to the sensor signal in the second signal path; and reading in the sensor signal, to which the second test signal has been applied, from the second output interface to the second signal path in order to test the second signal path and the second converter device, and reading in the sensor signal from the first output interface to the first signal path in order to evaluate the sensor signal.

The method or the steps of the method can be carried out using a control unit. In the application steps, a signal level of the sensor signal can be changed by feeding in the first test signal or the second test signal. In this case, a short circuit to another signal or a defect of the first converter device or of the second converter device can be detected. Additionally or alternatively, at least one defined signal level in the valid measurement range can be fed in in the application steps.

The approach presented here also provides a control unit which is configured to carry out, control and/or implement the steps of a variant of a method presented here in appropriate devices. The object on which the invention is based can also be achieved quickly and efficiently by this embodiment variant of the invention in the form of a control unit.

For this purpose, the control unit may have at least one computing unit for processing signals or data, at least one memory unit for storing signals or data, at least one interface to a sensor or an actuator for reading in sensor signals from the sensor or for outputting control signals to the actuator and/or at least one communication interface reading in or outputting data which are embedded in a communication protocol. The computing unit may be, for example, a signal processor, a microcontroller or the like, wherein the memory unit may be a flash memory, an EEPROM or a magnetic memory unit. The communication interface may be configured to read in or output data in a wireless and/or wired manner, wherein a communication interface which can read in or output wired data may read in these data electrically or optically from a corresponding data transmission line, for example, or can output these data to a corresponding data transmission line.

In the present case, a control unit may be understood as meaning an electrical unit which processes sensor signals and, on the basis thereof, outputs control and/or data signals. The control unit may have an interface which may be configured using hardware and/or software. In the case of a hardware configuration, the interfaces may be part of a so-called system ASIC, for example, which comprises a wide variety of functions of the control unit. However, it is also possible for the interfaces to be separate integrated circuits or to at least partially consist of discrete components. In the case of a software configuration, the interfaces may be software modules which are present, for example, on a microcontroller in addition to other software modules.

A braking system for a vehicle is also presented, wherein the braking system has the following features:
a sensor, wherein the sensor is configured to output a sensor signal;
an embodiment of the apparatus mentioned above; and
an embodiment of the control unit mentioned above, wherein the sensor is connected to the control unit with signal transmission capability via the apparatus.

In connection with the braking system, an embodiment of the apparatus mentioned above and an embodiment of the control unit mentioned above can be advantageously utilized or used to enable signal evaluation and a test function. The braking system may have a trailer control module for controlling braking functions of a trailer of the vehicle.

According to one embodiment, the control unit may have the first converter device and the second converter device. Such an embodiment provides the advantage that two-channel signal processing can be enabled in a simple and reliable manner.

The control unit may also have at least parts of the first test device of the apparatus and at least parts of the second test device of the apparatus. In particular, the control unit may have the test voltage sources and the switching devices of the test devices. Such an embodiment provides the advantage that the apparatus can also be implemented with the efficient inclusion or use of units which are already present anyway.

Also advantageous is a computer program product or computer program having program code which can be stored on a machine-readable carrier or storage medium such as a semiconductor memory, a hard disk memory or an optical memory and is used to carry out, implement and/or control the steps of the method according to one of the embodiments described above, in particular if the program product or program is executed on a computer or an apparatus.

Exemplary embodiments of the approach presented here are explained in more detail in the following description with reference to the figures.

DETAILED DESCRIPTION

Figure 1:
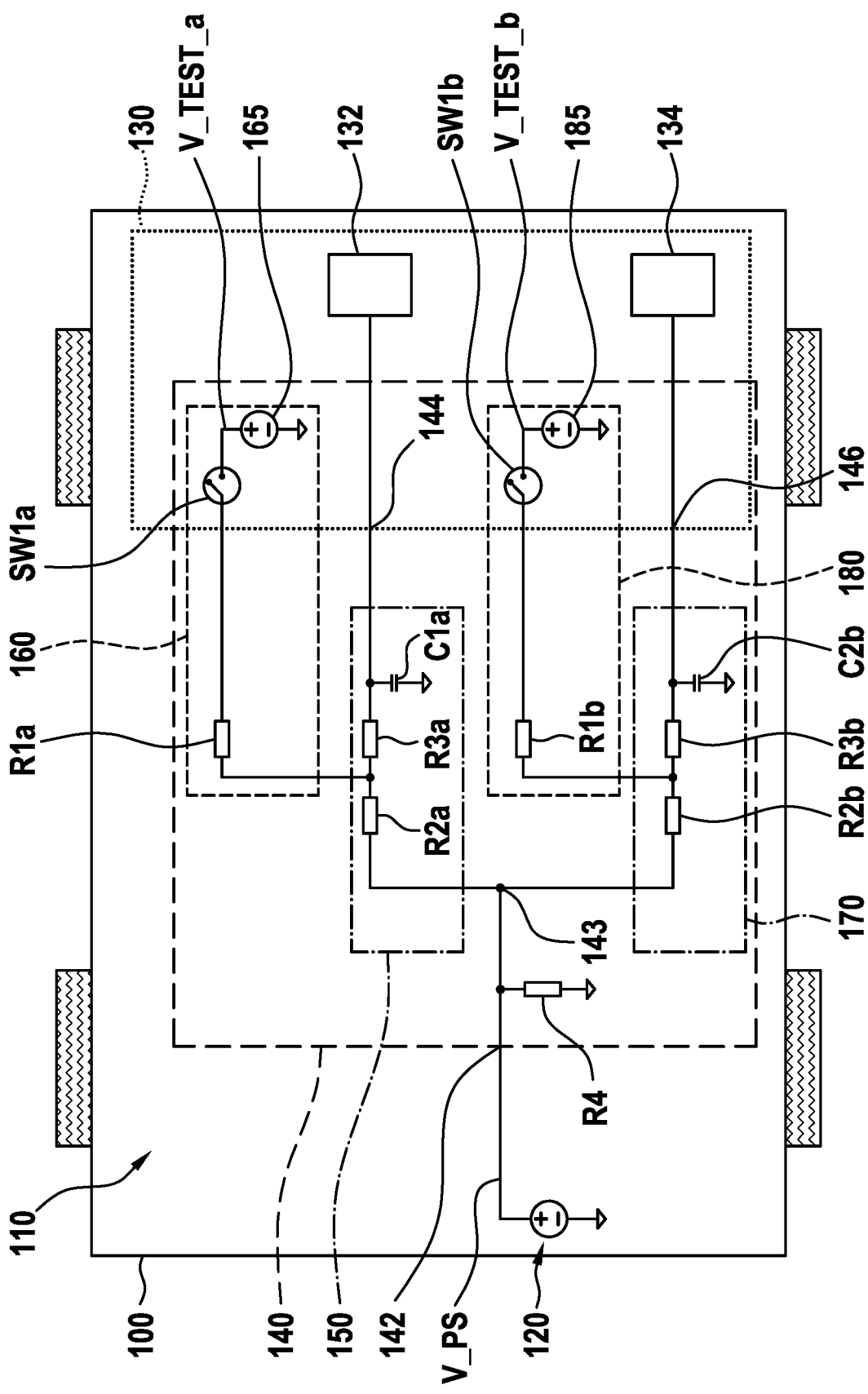
FIG. 1 shows a schematic illustration of a vehicle having a braking system according to one exemplary embodiment.

FIG. 1 shows a schematic illustration of a vehicle 100 having a braking system 110 according to one exemplary embodiment. The vehicle 100 is a motor vehicle, for example a commercial vehicle, in particular a truck or the like. According to the exemplary embodiment illustrated here, only a sensor 120, a control unit 130 and a provision apparatus 140 of the braking system 110 are shown by way of example.

The sensor 120 is in the form of a pressure sensor, for example. In particular, the sensor 120 is in the form of a pressure sensor for a trailer control module of the braking system 110. The sensor 120 is configured to output a sensor signal V_PS. In this case, the sensor signal V_PS may represent an electrical voltage or electrical voltage values. The sensor 120 is connected to the control unit 130 with signal transmission capability via the provision apparatus 140. The control unit 130 may configured as a control unit of the braking system 110 or for the braking system 110.

The provision apparatus 140 is configured to provide the sensor signal V_PS for evaluation for the braking system 110. The provision apparatus 140 has a first signal path 150, a first test device 160, a second signal path 170 and a second test device 180. The provision apparatus 140 also has an input interface 142, a first output interface 144 and a second output interface 146.

The first signal path 150 is configured to output the sensor signal V_PS to the first output interface 144 to a first converter device. The first signal path 150 has first electronic components. The first signal path 150 is also electrically connected to the input interface 142 to the sensor 120. More precisely, the first signal path 150 is electrically connected between the input interface 142 and the first output interface 144. The input interface 142 is therefore connected to the first output interface 144 with signal transmission capability or electrically via the first signal path 150. The first test device 160 is configured to apply a first test signal V_TEST_a to the sensor signal V_PS in the first signal path 150. For this purpose, the first test device 160 is connected to the first signal path 150 electrically or with signal transmission capability.

The second signal path 170 is configured to output the sensor signal V_PS to the second output interface 146 to a second converter device. The second signal path 170 has second electronic components. The second signal path 170 is also electrically connected to the input interface 142 to the sensor 120. More precisely, the second signal path 170 is electrically connected between the input interface 142 and the second output interface 146. The input interface 142 is therefore connected to the second output interface 146 with signal transmission capability or electrically via the second signal path 170. The second test device 180 is configured to apply a second test signal V_TEST_b to the sensor signal V_PS in the second signal path 170. For this purpose, the second test device 180 is connected to the second signal path 170 electrically or with signal transmission capability.

The first signal path 150 and the second signal path 170 of the provision apparatus 140 are electrically connected in parallel with one another. At a branching point 143, an input signal path branches from the input interface 142 into the first signal path 150 and the second signal path 170. According to the exemplary embodiment illustrated here, the control unit 130 has the first converter device 132 and the second converter device 134. The first converter device 132 is connected to the first output interface 144 and therefore to the first signal path 150 of the provision apparatus 140 electrically or with signal transmission capability. The second converter device 134 is connected to the second output interface 146 and therefore to the second signal path 170 of the provision apparatus 140 electrically or with signal transmission capability.

According to the exemplary embodiment illustrated here, the first signal path 150 has, as electronic components, two first electrical resistors $R2a$ and $R3a$ and a first capacitance $C1a$. The two first electrical resistors $R2a$ and $R3a$ are electrically connected in series with one another. Between the two first electrical resistors $R2a$ and $R3a$, the first test device 160 is electrically connected to the first signal path 150. Between the two first electrical resistors $R2a$ and $R3a$, on the one hand, and the first output interface 144, on the other hand, the first capacitance $C1a$ is electrically connected between the first signal path 150 and ground. The first signal path 150 extends between the branching point 143 and the first output interface 144.

According to the exemplary embodiment illustrated here, the first test device 160 has a first electrical test voltage source 165, a first electrical test resistor $R1a$ and a first switching device $SW1a$. The first electrical test voltage source 165 is configured to generate the first test signal V_TEST_a. The first switching device $SW1a$ is configured to connect the first test device 160 to the first signal path 150 with signal transmission capability or electrically. In this case, the first switching device $SW1a$ is electrically connected between the first test voltage source 165 and the first electrical test resistor $R1a$. The first electrical test resistor $R1a$ is therefore electrically connected between the first switching device $SW1a$ and the first signal path 150. Alternatively, the first electrical test resistor $R1a$ may also be considered to be part of the first signal path 150.

Furthermore, according to the exemplary embodiment illustrated here, the second signal path 170 has, as electronic components, two second electrical resistors $R2b$ and $R3b$ and a second capacitance $C2b$. The two second electrical resistors $R2b$ and $R3b$ are electrically connected in series with one another. Between the two second electrical resistors $R2b$ and $R3b$, the second test device 180 is electrically connected to the second signal path 170. Between the two second electrical resistors $R2b$ and $R3b$, on the one hand, and the second output interface 146, on the other hand, the second capacitance $C2b$ is electrically connected between the second signal path 170 and ground. The second signal path 170 extends between the branching point 143 and the second output interface 146.

According to the exemplary embodiment illustrated here, the second test device 180 has a second electrical test voltage source 185, a second electrical test resistor $R1b$ and a second switching device $SW1b$. The second electrical test voltage source 185 is configured to generate the second test signal V_TEST_b. The second switching device $SW1b$ is configured to connect the second test device 180 to the second signal path 170 with signal transmission capability or electrically. In this case, the second switching device $SW1b$ is electrically connected between the second test voltage source 185 and the second electrical test resistor $R1b$. The second electrical test resistor $R1b$ is therefore electrically connected between the second switching device $SW1b$ and the second signal path 170. Alternatively, the second electrical test resistor $R1b$ may also be considered to be part of the second signal path 170.

According to the exemplary embodiment illustrated here, the provision apparatus 140 also has an electrical input resistor $R4$. The electrical input resistor $R4$ is arranged between the input interface 142 and the branching point 143. In this case, the input resistor $R4$ is electrically connected between the input interface 142 and ground.

According to the exemplary embodiment illustrated here, the control unit 130 has the first electrical test voltage source 165, the first switching device SW1a, the second electrical test voltage source 185 and the second switching device SW1b. According to another exemplary embodiment, the control unit 130 may have further, different or no elements of the provision apparatus 140.

Again in summary and in other words, the sensor 120 provides an electrical voltage as a sensor signal V_PS which is loaded with the electrical input resistance R4 by the provision apparatus 140. The control unit 130 is in the form of a microcontroller, for example. The sensor signal V_PS guided to the control unit 130 via the first signal path 150 is evaluated, for example, at a first analog/digital converter channel or at the first converter device 132. The sensor signal V_PS guided to the control unit 130 via the second signal path 170 is evaluated, for example, at a second analog/digital converter channel or at the second converter device 134. If the first switching device SW1a is open, the first test device 160 acts as a high-impedance input of the control unit 130. If the first switching device SW1a is closed, the first test device 160 acts as an output of the control unit 130, wherein the sensor signal V_PS in the first signal path 150 can be changed via the first electrical test resistor R1a by generating the first test signal V_TEST_a with a logically high level or a logically low level. If a change in the sensor signal V_PS transmitted via the first signal path 150 is then measured, it can be determined that the analog/digital converter channel or the first converter device 132 and the first signal path 150 basically function. In the meantime, the sensor signal V_PS on the second signal path 170 can still be continuously measured and evaluated. Test and measurement paths are swapped in order to test the second signal path 170, that is to say the first switching device SW1a is opened and the second switching device SW1b is closed.

Figure 2:
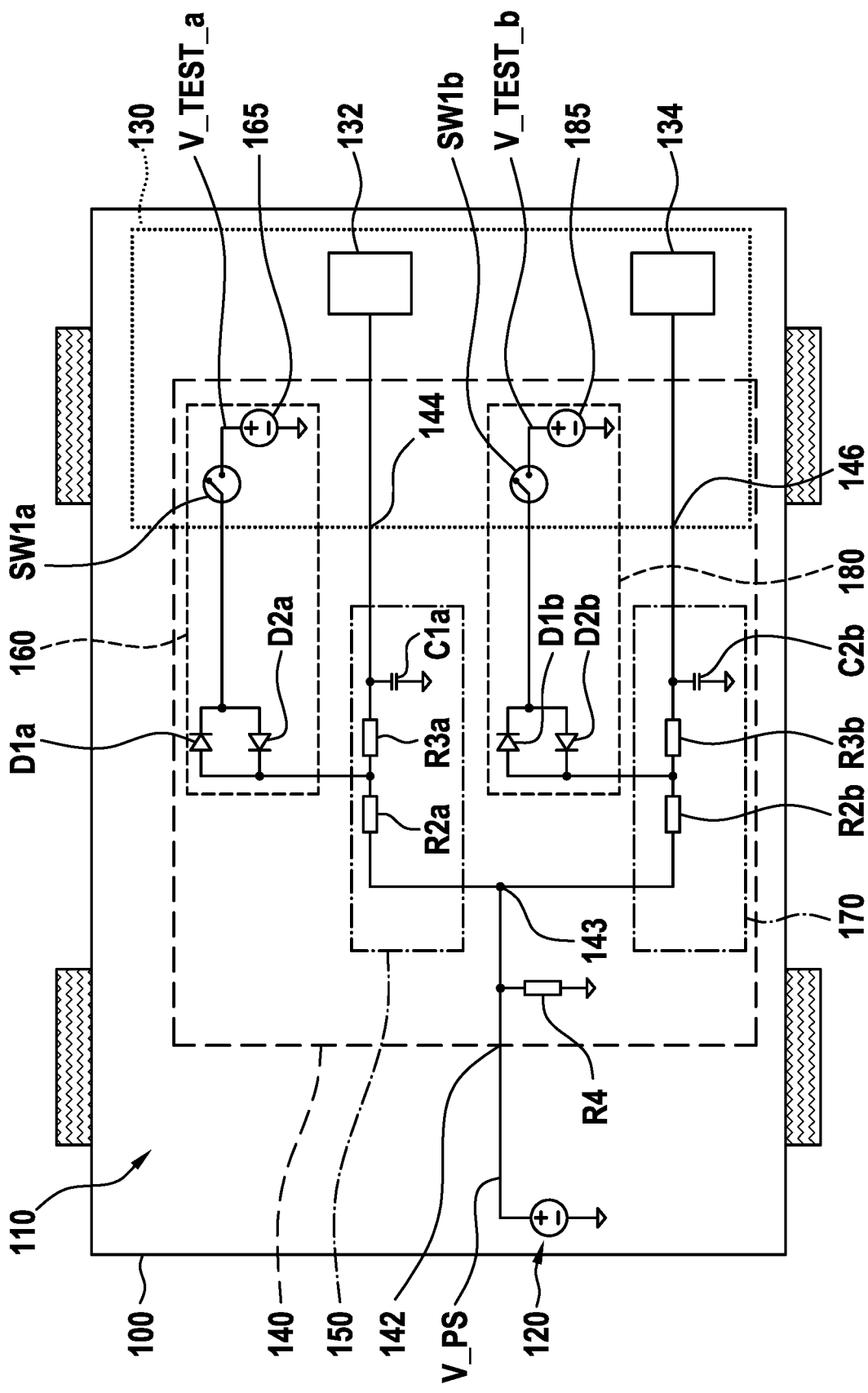
FIG. 2 shows a schematic illustration of a vehicle having a braking system according to one exemplary embodiment.

FIG. 2 shows a schematic illustration of a vehicle 100 having a braking system 110 according to one exemplary embodiment. The braking system 110 corresponds in this case to the braking system from FIG. 1 with the exception of the fact that the provision apparatus 140 has a different configuration. More precisely, the first test device 160 of the provision apparatus 140 has a parallel circuit comprising two first test diodes D1a and D2a instead of the first electrical test resistor and the second test device 180 of the provision apparatus 140 has a parallel circuit comprising two second test diodes D1b and D2b instead of the second electrical test resistor.

The first test diodes D1a and D2a which are electrically connected in parallel with one another are therefore electrically connected between the first switching device SW1a of the first test device 160 and the first signal path 150. In this case, the first test diodes D1a and D2a are electrically connected in parallel with mutually opposite forward directions. Furthermore, the second test diodes D1b and D2b which are electrically connected in parallel with one another are electrically connected between the second switching device Sw1b of the second test device 180 and the second signal path 170. In this case, the second test diodes D1b and D2b are electrically connected in parallel with mutually opposite forward directions.

According to the exemplary embodiment illustrated in FIG. 2, a more accurately defined voltage can be fed into and impressed on the sensor signal V_PS in the first signal path 150 and in the second signal path 170, for example 0.7 volts and VCC −0.7 volts, using the same test process as in FIG. 1. In comparison with directly feeding in logically high levels or logically low levels of the test signals V_TEST_a and V_TEST_b, it is therefore possible to measure not only limit values of the analog/digital converter channels or converter devices 132 and 134 but also electrical voltages in the valid measurement range. These values therefore differ from possibly connected short circuits with respect to GND or ground or VCC or the supply voltage.

According to one exemplary embodiment, the test devices 160 and 180 may also each have a combination of the test resistors R1a and R1b and the test diodes D1a and/or D2a or D1b and/or D2b. Instead of a test diode, a more accurate reference voltage can also be used according to one exemplary embodiment.

An exemplary embodiment in which the components C1a and C2b are not absolutely necessary and can also be dispensed with is also conceivable. In this case, a microcontroller could then carry out the filtering, for example. According to a further exemplary embodiment, the components D1a, D2a, D1b, D2b may also be in the form of Schottky diodes, which have a lower breakdown voltage than normal diodes, or in the form of Zener diodes. An exemplary embodiment in which only one Zener diode and one normal diode are used for each test device is also conceivable since otherwise an effect like two normal diodes is present when using two Zener diodes. A fixed test voltage could therefore also be between GND +0.7 V and VCC −0.7 V. The test voltage can also be generated by the microcontroller by connecting a port in a low-impedance manner with respect to VCC or GND.

Figure 3:
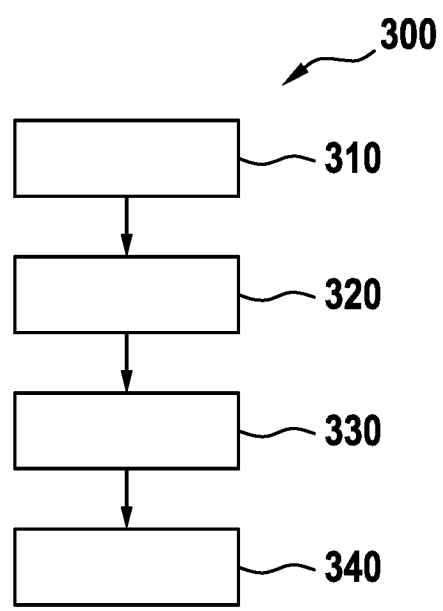
FIG. 3 shows a flowchart of an evaluation method according to one exemplary embodiment.

FIG. 3 shows a flowchart of an evaluation method 300 according to one exemplary embodiment. The evaluation method 300 can be carried out in order to evaluate a sensor signal for a braking system of a vehicle. In this case, the evaluation method 300 can be carried out in conjunction with the apparatus from one of the figures described above or a similar apparatus. The evaluation method 300 can also be carried out using the control unit from one of the figures described above or a similar control unit.

According to the exemplary embodiment illustrated here, the evaluation method 300 has a first application step 310, a first reading-in step 320, a second application step 330 and a second reading-in step 340.

In the first application step 310, the first test signal is applied only to the sensor signal in the first signal path. In the first reading-in step 320, the sensor signal, to which the first test signal has been applied, is read in from the first output interface to the first signal path in order to test the first signal path and the first converter device, and the sensor signal is read in from the second output interface to the second signal path in order to evaluate the sensor signal. In the second application step 330, the second test signal is then applied only to the sensor signal in the second signal path. In the second reading-in step 340, the sensor signal, to which the second test signal has been applied, is read in from the second output interface to the second signal path in order to test the second signal path and the second converter device, and the sensor signal is read in from the first output interface to the first signal path in order to evaluate the sensor signal.

In this case, the first application step 310 and the first reading-in step 320 can be carried out in an at least partially overlapping manner in terms of time with respect to one another and the second application step 330 and the second reading-in step 340 can be carried out in an at least partially overlapping manner in terms of time with respect to one another. After the second reading-in step 340, the evaluation method 300 can begin again with the first application step 310.

THE LIST OF REFERENCE SIGNS IS AS FOLLOWS

100 Vehicle
110 Braking system
120 Sensor
130 Control unit
132 First converter device
134 Second converter device
140 Apparatus
142 Input interface
143 Branching point
144 First output interface
146 Second output interface
150 First signal path
160 First test device
170 Second signal path
180 Second test device
165 First electrical test voltage source
185 Second electrical test voltage source
C1a First capacitance
C2b Second capacitance
R1a First electrical test resistor
R1b Second electrical test resistor
R2a, R3a First electrical resistors
R2b, R3b Second electrical resistors
R4 Input resistor
SW1a First switching device
SW1b Second switching device
V_PS Sensor signal
V_TEST_a First test signal
V_TEST_b Second test signal
D1a, D2a First test diodes
D1b, D2b Second test diodes
300 Evaluation method
310 First application step
320 First reading-in step
330 Second application step
340 Second reading-in step

The invention claimed is:

1. An apparatus for providing a sensor signal for evaluation for a braking system of a vehicle, comprising:
a first signal path for outputting the sensor signal to a first output interface to a first converter device, wherein the first signal path has first electronic components, wherein the first signal path is electrically connectable or connected to an input interface to a sensor of the vehicle;
a first test device for applying a first test signal to the sensor signal in the first signal path, wherein the first test device is electrically connectable or connected to the first signal path;
a second signal path for outputting the sensor signal to a second output interface to a second converter device, wherein the second signal path has second electronic components, wherein the second signal path is electrically connectable or connected to the input interface to the sensor of the vehicle; and
a second test device for applying a second test signal to the sensor signal in the second signal path, wherein the second test device is electrically connectable or connected to the second signal path.

2. The apparatus of claim 1, wherein the first test device has a first electrical test voltage source for generating the first test signal and a first switching device for connecting the first test device to the first signal path with signal transmission capability, wherein the second test device has a second electrical test voltage source for generating the second test signal and a second switching device for connecting the second test device to the second signal path with signal transmission capability.

3. The apparatus of claim 1, wherein the first test device has a first electrical test resistor and/or a parallel circuit including one or two first test diodes, wherein the second test device has a second electrical test resistor and/or a parallel circuit including one or two second test diodes.

4. The apparatus of claim 1, wherein the first electronic components of the first signal path have two first electrical resistors, which are electrically connected in series with one another, and a first capacitance, wherein the first test device is electrically connected to the first signal path between the first resistors, wherein, between the first resistors and the first output interface, the first capacitance is electrically connected between the first signal path and ground, wherein the second electronic components of the second signal path have two second electrical resistors, which are electrically connected in series with one another, and a second capacitance, wherein the second test device is electrically connected to the second signal path between the second resistors, wherein, between the second resistors and the second output interface, the second capacitance is electrically connected between the second signal path and ground.

5. The apparatus of claim 1, further comprising:
an electrical input resistor which is electrically connected between the input interface and ground.

6. A method for evaluating a sensor signal for a braking system of a vehicle, the method comprising:
applying a first test signal only to a sensor signal in a first signal path;
reading in the sensor signal, to which the first test signal has been applied, from a first output interface to the first signal path to test the first signal path and a first converter device, and reading in the sensor signal from a second output interface to a second signal path to evaluate the sensor signal;
applying the second test signal only to the sensor signal in the second signal path; and
reading in the sensor signal, to which the second test signal has been applied, from the second output interface to the second signal path to test the second signal path and a second converter device, and reading in the sensor signal from the first output interface to the first signal path to evaluate the sensor signal.

7. A control unit, comprising:
a control device for evaluating a sensor signal for a braking system of a vehicle, by performing the following:
applying a first test signal only to a sensor signal in a first signal path;
reading in the sensor signal, to which the first test signal has been applied, from a first output interface to the first signal path to test the first signal path and a first converter device, and reading in the sensor signal from a second output interface to a second signal path to evaluate the sensor signal;
applying the second test signal only to the sensor signal in the second signal path; and
reading in the sensor signal, to which the second test signal has been applied, from the second output interface to the second signal path to test the second signal path and a second converter device, and reading in the sensor signal from the first output interface to the first signal path to evaluate the sensor signal.

8. A braking system for a vehicle, comprising:
- a sensor to output a sensor signal;
- an apparatus for providing a sensor signal for evaluation for the braking system of the vehicle, including:
  - a first signal path for outputting the sensor signal to a first output interface to a first converter device, wherein the first signal path has first electronic components, wherein the first signal path is electrically connectable or connected to an input interface to a sensor of the vehicle;
  - a first test device for applying a first test signal to the sensor signal in the first signal path, wherein the first test device is electrically connectable or connected to the first signal path;
  - a second signal path for outputting the sensor signal to a second output interface to a second converter device, wherein the second signal path has second electronic components, wherein the second signal path is electrically connectable or connected to the input interface to the sensor of the vehicle; and
  - a second test device for applying a second test signal to the sensor signal in the second signal path, wherein the second test device is electrically connectable or connected to the second signal path;
- a control unit for evaluating the sensor signal for the braking system of the vehicle, by performing the following:
  - applying the first test signal only to the sensor signal in the first signal path;
  - reading in the sensor signal, to which the first test signal has been applied, from the first output interface to the first signal path to test the first signal path and the first converter device, and reading in the sensor signal from the second output interface to the second signal path to evaluate the sensor signal;
  - applying the second test signal only to the sensor signal in the second signal path; and
  - reading in the sensor signal, to which the second test signal has been applied, from the second output interface to the second signal path to test the second signal path and the second converter device, and reading in the sensor signal from the first output interface to the first signal path to evaluate the sensor signal;
- wherein the sensor is connected to the control unit with signal transmission capability via the apparatus.

9. The braking system of claim 8, wherein the control unit has the first converter device and the second converter device.

10. The braking system of claim 8, wherein the control unit has at least parts of the first test device of the apparatus and at least parts of the second test device of the apparatus.

11. A non-transitory computer readable medium having a computer program, which is executable by a processor, comprising:
- a program code arrangement having program code for evaluating a sensor signal for a braking system of a vehicle, by performing the following:
  - applying a first test signal only to a sensor signal in a first signal path;
  - reading in the sensor signal, to which the first test signal has been applied, from a first output interface to the first signal path to test the first signal path and a first converter device, and reading in the sensor signal from a second output interface to a second signal path to evaluate the sensor signal;
  - applying the second test signal only to the sensor signal in the second signal path; and
  - reading in the sensor signal, to which the second test signal has been applied, from the second output interface to the second signal path to test the second signal path and a second converter device, and reading in the sensor signal from the first output interface to the first signal path to evaluate the sensor signal.

12. The computer readable medium of claim 11, wherein the first test device has a first electrical test voltage source for generating the first test signal and a first switching device for connecting the first test device to the first signal path with signal transmission capability, wherein the second test device has a second electrical test voltage source for generating the second test signal and a second switching device for connecting the second test device to the second signal path with signal transmission capability.

* * * * *